United States Patent
Nath et al.

(10) Patent No.: US 11,430,881 B2
(45) Date of Patent: Aug. 30, 2022

(54) DIODE TRIGGERED COMPACT SILICON CONTROLLED RECTIFIER

(71) Applicant: GLOBALFOUNDRIES U.S. INC., Santa Clara, CA (US)

(72) Inventors: Anindya Nath, Essex Junction, VT (US); Alain F. Loiseau, Williston, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 48 days.

(21) Appl. No.: 16/810,076

(22) Filed: Mar. 5, 2020

(65) Prior Publication Data
US 2021/0280699 A1  Sep. 9, 2021

(51) Int. Cl.
| | |
|---|---|
| H01L 29/04 | (2006.01) |
| H01L 29/74 | (2006.01) |
| H01L 29/73 | (2006.01) |

(52) U.S. Cl.
CPC .......... *H01L 29/7412* (2013.01); *H01L 29/04* (2013.01); *H01L 29/7302* (2013.01)

(58) Field of Classification Search
CPC . H01L 29/7412; H01L 29/7302; H01L 29/04; H01L 22/30; G01R 31/2884
USPC ..................................... 257/48, 49
See application file for complete search history.

(56) References Cited

U.S. PATENT DOCUMENTS

| | | | | |
|---|---|---|---|---|
| 5,719,411 A | * | 2/1998 | Ajit ..................... | H01L 29/7412 257/163 |
| 6,338,986 B1 | * | 1/2002 | Kawazoe ............ | H01L 29/7412 361/111 |
| 6,815,732 B1 | * | 11/2004 | Vashchenko ........ | H01L 29/7436 257/107 |
| 6,919,588 B1 | * | 7/2005 | Vashchenko ........ | H01L 27/0248 257/107 |
| 6,933,573 B2 | | 8/2005 | Ker et al. | |
| 7,471,493 B1 | | 12/2008 | Huang et al. | |
| 7,609,493 B1 | | 10/2009 | Salman et al. | |
| 9,461,032 B1 | * | 10/2016 | Edwards ............. | H01L 27/0259 |
| 9,847,408 B1 | * | 12/2017 | Jain ................... | H01L 21/82285 |
| 10,008,491 B1 | | 6/2018 | Li et al. | |
| 2002/0064007 A1 | | 5/2002 | Chang et al. | |
| 2003/0213971 A1 | * | 11/2003 | Yu .......................... | H01L 29/87 257/119 |
| 2004/0051147 A1 | * | 3/2004 | Panday ............... | H01L 21/8249 257/368 |

(Continued)

FOREIGN PATENT DOCUMENTS

EP  2395620  12/2011

OTHER PUBLICATIONS

Office Action dated Jul. 6, 2020 for related U.S. Appl. No. 16/455,071, 12 pages.

(Continued)

*Primary Examiner* — Sheikh Maruf
(74) *Attorney, Agent, or Firm* — Anthony Canale; Andrew M. Calderon; Roberts Calderon Safran & Cole, P.C.

(57) ABSTRACT

The present disclosure relates to a polysilicon-diode triggered compact silicon controlled rectifier. In particular, the present disclosure relates to a structure including a silicon controlled rectifier (SCR) which includes an n-well adjacent and in direct contact with a p-well, the SCR includes at least one shallow trench isolation (STI) region, and at least one polysilicon diode on top of the at least one STI region.

15 Claims, 5 Drawing Sheets

(56) References Cited

U.S. PATENT DOCUMENTS

| | | | |
|---|---|---|---|
| 2004/0110353 A1* | 6/2004 | Mallikarjunaswamy | H01L 29/7393 438/309 |
| 2006/0231893 A1 | 10/2006 | Bernstein et al. | |
| 2007/0267700 A1 | 11/2007 | Russ et al. | |
| 2008/0048215 A1* | 2/2008 | Davies | H01L 27/0262 257/274 |
| 2009/0152587 A1* | 6/2009 | Cerati | H01L 21/76237 257/147 |
| 2010/0271851 A1* | 10/2010 | Ankoudinov | H01L 27/0811 363/126 |
| 2013/0075854 A1* | 3/2013 | Chang | H01L 29/1008 257/E27.023 |
| 2013/0242448 A1* | 9/2013 | Salcedo | H01L 27/0259 361/111 |
| 2014/0131710 A1* | 5/2014 | Chung | H01L 27/0262 257/499 |
| 2014/0138735 A1* | 5/2014 | Clarke | H01L 27/0635 257/119 |
| 2015/0023105 A1* | 1/2015 | Widjaja | H01L 29/0804 257/315 |
| 2015/0060939 A1* | 3/2015 | Di Sarro | H01L 29/861 257/140 |
| 2015/0236011 A1* | 8/2015 | Wang | H01L 29/87 257/173 |
| 2016/0173083 A1* | 6/2016 | Alexander | H01L 29/7416 327/425 |
| 2016/0225755 A1* | 8/2016 | Wang | H01L 27/0266 |
| 2017/0062406 A1* | 3/2017 | Ko | H01L 29/0649 |
| 2017/0141097 A1* | 5/2017 | Bobde | H01L 29/66371 |
| 2017/0256535 A1* | 9/2017 | Nandakumar | H01L 27/0922 |
| 2017/0287894 A1* | 10/2017 | Kuo | H01L 29/7821 |
| 2017/0323882 A1* | 11/2017 | Langguth | H01L 27/0296 |
| 2019/0181134 A1* | 6/2019 | Salman | H01L 29/0646 |
| 2019/0319454 A1 | 10/2019 | Sithanandam et al. | |
| 2020/0083212 A1* | 3/2020 | Zhao | H01L 29/0649 |
| 2020/0365716 A1* | 11/2020 | Chen | H01L 27/0255 |

OTHER PUBLICATIONS

Final Office Action dated Dec. 30, 2020 in related U.S. Appl. No. 16/455,071, 18 pages.

Philippe Galy et al.,"Ultracompact ESD Protection With BIMOS-Merged Dual Back-to-Back SCR in Hybrid Bulk 28-nm FD-SOI Advanced CMOS Technology", IEEE Transactions on Electron Devices, vol. 64, No. 10, Oct. 2017, 7 pages.

Dray et al., "ESD design challenges in 28nm hybrid FDSOI/Bulk advanced CMOS process", IEEE, Oct. 18, 2012, 7 pages.

Specification and Figures for related U.S. Appl. No. 16/455,071, filed Jun. 27, 2019.

Response to Office Action dated Nov. 5, 2021 in related U.S. Appl. No. 16/455,071, 13 pages.

Office Action dated Aug. 11, 2021 in related U.S. Appl. No. 16/455,071, 18 pages.

Notice of Allowance dated Feb. 14, 2022 in related U.S. Appl. No. 16/455,071, 8 pages.

* cited by examiner

DIODE TRIGGERED COMPACT SILICON CONTROLLED RECTIFIER

FIELD OF THE INVENTION

The present disclosure relates to semiconductor structures, and more particularly, to a diode triggered compact silicon controlled rectifier and methods of operation.

BACKGROUND

Diode triggered silicon controlled rectifier (DTSCR) are used for electrostatic discharge (ESD) protection due to their precisely tunable triggering voltage. Incorporating diode structures into silicon controlled rectifiers (SCRs) increases the overall footprint and capacitance. In addition, for bulk-technologies, a finite bipolar current gain leads to a Darlington effect in string diodes which mitigates trigger voltage modulation ability of such structures.

For example, diode triggered silicon controlled rectifiers (DTSCRs) exhibit the Darlington effect which reduces the current drive to each subsequent diode's emitters. Further, when trigger diodes are created as a hybrid of silicon-on-insulator (SOI) and bulk diodes, these trigger diodes lead to an increased footprint because they are built on one or both sides of the SCRs. Further, by having longer connecting wires from diodes to SCR, the capacitance is increased.

SUMMARY

In an aspect of the disclosure, a structure includes a silicon controlled rectifier (SCR) which includes an n-well adjacent and in direct contact with a p-well, the SCR includes at least one shallow trench isolation (STI) region, and at least one polysilicon diode on top of that least one STI region.

In another aspect of the disclosure, a structure includes a silicon controlled rectifier (SCR) which includes a PNP transistor and a NPN transistor in series, and at least one polysilicon diode connected to the PNP transistor and the NPN transistor.

In another aspect of the disclosure, a structure includes a silicon controlled rectifier (SCR) which includes a PNP transistor and a NPN transistor in series, and at least one polysilicon bipolar device connected to the PNP transistor and the NPN transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures, and more particularly, to a diode triggered compact silicon controlled rectifier and methods of operation. More specifically, the present disclosure provides a polysilicon-diode triggered silicon controlled rectifier (SCR) in which trigger diodes are formed on polysilicon on shallow trench isolation (STI) regions in between SCR terminals. Advantageously, by implementing the circuits and structures disclosed herein, the trigger voltage tenability is maintained and can be implemented with any number of trigger diodes. Therefore, the present disclosure provides electrostatic discharge (ESD) protection for a mid voltage range or a high voltage range.

Also, by implementing the circuits disclosed herein, the Darlington effect observed in DTSCRs is mitigated. Further, by implementing the circuits disclosed herein, polysilicon-implanted lateral devices can be aligned with any bulk or silicon-on-insulator (SOI) process. In embodiments of the present disclosure, the trigger diodes can be replaced by lateral PNP devices formed over a single STI region, or a combination of STI regions. Therefore, by implementing the circuits and structures disclosed herein, device leakage, on resistance, capacitance, and device footprint can be reduced.

In known circuits, a diode in bulk technologies can lead to a Darlington/leakage issue. Further, in known circuits, the diode being outside of the SCR leads to a larger device footprint. Also, in known circuits, extra junction area capacitance results from the bulk diode. In contrast, in the present disclosure, polysilicon diodes are built on the STI regions of the SCR which reduces the device footprint (i.e., approximately 29% area savings), prevents the Darlington effect because these diodes have only two terminals, and reduces silicon coupling. Further, in the present disclosure, when using silicide to connect device terminals, the capacitance can be reduced. Also, in the present disclosure, the anode to cathode separation is reduced, which results in a smaller on resistance. In the present disclosure, the decreased wiring is also due to the diode proximity to the SCR.

Figure 1:
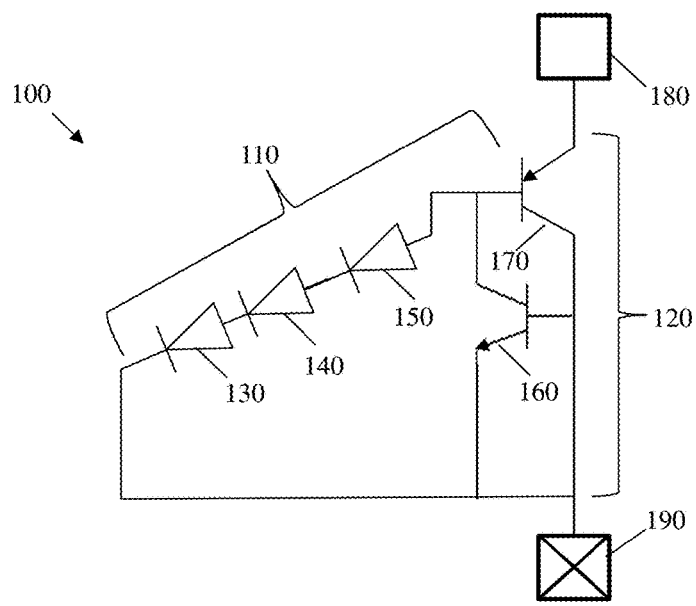
FIG. 1 shows a schematic diagram of a diode triggered silicon controlled rectifier (DTSCR) in accordance with aspects of the present disclosure.

FIG. 1 shows a schematic diagram of a diode triggered silicon controlled rectifier (DTSCR) in accordance with aspects of the present disclosure. In FIG. 1, the DTSCR structure 100 includes a string 110 which comprises polysilicon trigger diodes 130, 140, and 150. The polysilicon trigger diodes 130, 140, and 150 are formed on shallow trench isolation (STI) regions to avoid a Darlington connection (i.e., a Darlington effect). The DTSCR structure 100 also includes a silicon controlled rectifier 120 which comprises a PNP transistor 170 and a NPN transistor 160. Further, the silicon controlled rectifier 120 is between a signal pad 180 and ground 190.

In FIG. 1, the polysilicon trigger diodes 130, 140, and 150 are formed on STI regions and in-between SCR terminals, which provides a significant reduction in a device footprint.

Further, by forming the polysilicon trigger diodes 130, 140, and 150 on multiple STI regions, metal length is shortened which reduces the capacitance. Although FIG. 1 shows three trigger diodes (i.e., polysilicon trigger diodes 130, 140, and 150), embodiments are not limited to three trigger diodes and could be two trigger diodes or more trigger diodes (e.g., up to five trigger diodes or greater).

Figure 2:
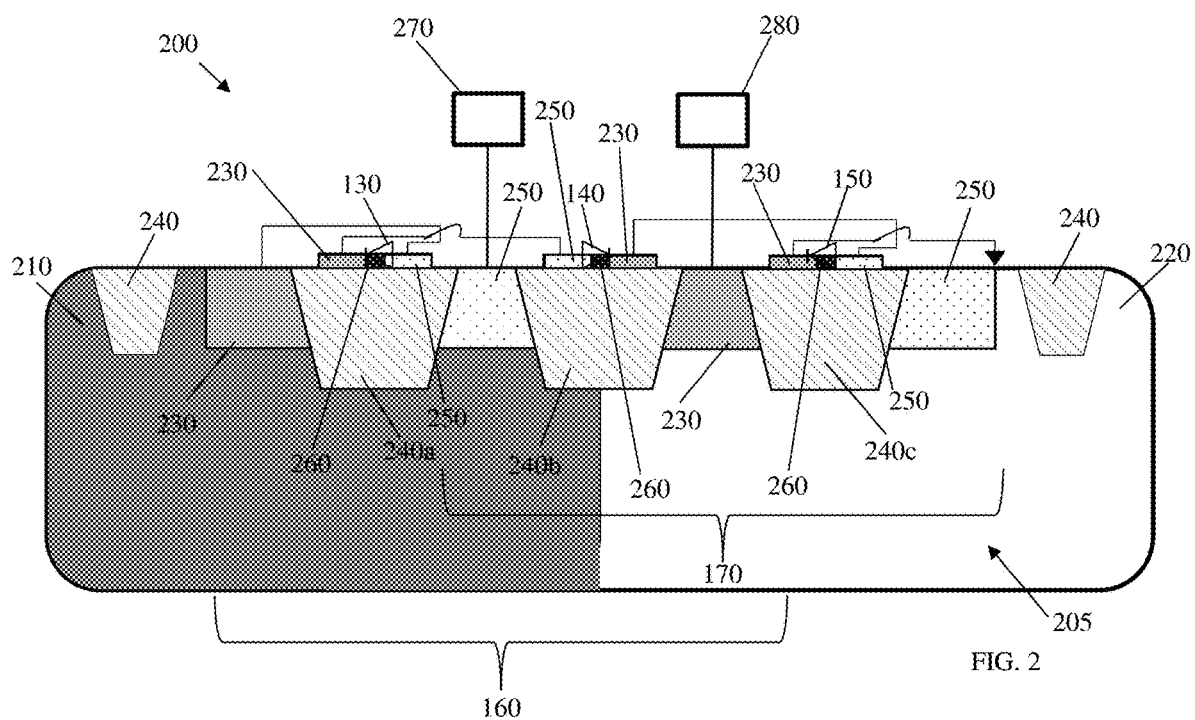
FIG. 2 shows a cross sectional view of the DTSCR in FIG. 1 in accordance with aspects of the present disclosure.

FIG. 2 shows a cross sectional view of the DTSCR in FIG. 1, in accordance with aspects of the present disclosure. In particular, the structure 200 includes a substrate 205 comprising an N-well 210 and a P-well 220. The N-well 210 and the P-well 220 are formed by conventional doping or ion-implantation processes known in the art. A plurality of shallow trench isolation (STI) regions 240, 240a, 240b, and 240c are formed in the substrate 205 using conventional lithography, etching, and deposition processes. For example, a resist patterned over the substrate 205 is exposed to energy (light) to form a pattern (opening). An etching process with a selective chemistry, e.g., RIE, will be used to form one or more trenches in the N-well 210 and the P-well 220, through the openings of the resist. Following the resist removal by a conventional oxygen ashing process or other known stipants, insulator material, e.g., oxide, can be deposited within the trenches by any conventional deposition processes, e.g., chemical vapor deposition (CVD) processes. Any residual material on the surface of the semiconductor material can be removed by conventional chemical mechanical polishing (CMP) processes. In embodiments, the substrate 205 may be composed of any suitable material including, but not limited to, Si, SiGe, SiGeC, SiC, GaAs, InAs, InP, and other III/V or II/VI compound semiconductors.

The substrate 205 can be semiconductor on insulator (SOI) or bulk technology. In SOI technology, an insulator layer is provided on top of a semiconductor layer (i.e., handle wafer). The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Another semiconductor layer is provided on top of the insulator layer to form a silicon-on-insulator (SOI) substrate, which can be fabricated using wafer bonding, and/or other suitable methods.

In embodiments, each of the shallow trench isolation (STI) regions 240a, 240b, and 240c is formed between an N+ region 230 and a P+ region 250. The N-well 210, the P-well 220, the N+ region 230, and the P+ region 250 can be formed by conventional ion implantation processes known to those of skill in the art.

For example, the wells (e.g., N-well 210 or P-well 220) may be formed by introducing a dopant by, for example, ion implantation that includes a concentration of a dopant in the substrate 205 and the DTSCR structure 100. The well may be formed by introducing a concentration of a different dopant or opposite conductivity type in the substrate 205 and the DTSCR structure 100. In embodiments, respective patterned implantation masks may be used to define selected areas exposed for the implantations. The implantation mask used to select the exposed area for forming the well is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 220 is doped with p-type dopants, e.g., Boron (B), and the N-well 210 is doped with n-type dopants, e.g., Arsenic (As), Phosphorus (P), and Sb, among other suitable examples. In embodiments, the N+ regions 230, the STI regions 240a, 240b, and the P+ region 250 will form the NPN transistor 160. The N+ region 230, the STI regions 240b, 240c, and the P+ regions 250 will form the PNP transistor 170.

Still referring to FIG. 2, the trigger diode 130 is formed on the STI region 240a, the trigger diode 140 is formed on the STI region 240b, and the trigger diode 250 is formed on the STI region 240c. In embodiments, the trigger diode 130 comprises the N+ region 230, polysilicon 260, and the P+ region 250 formed on the STI region 240a. The trigger diode 140, on the other hand, comprises the P+ region 250, the polysilicon 260, and the N+ region 230 formed on the STI region 240b. Also, the trigger diode 150 comprises the N+ region, the polysilicon 260, and the P+ region 250 formed on the STI region 240c. As shown in FIGS. 1 and 2, the trigger diodes 130, 140, and 150 are connected in series, which can avoid the Darlington connection (i.e., a Darlington effect). Further, an anode 270 is connected to the P+ region 250 and a cathode 280 is connected to the N+ region 230. In a specific embodiment, the STI region 240b has a smaller critical dimension (i.e., width) than the STI regions 240a and 240c.

Figures 3, 4:
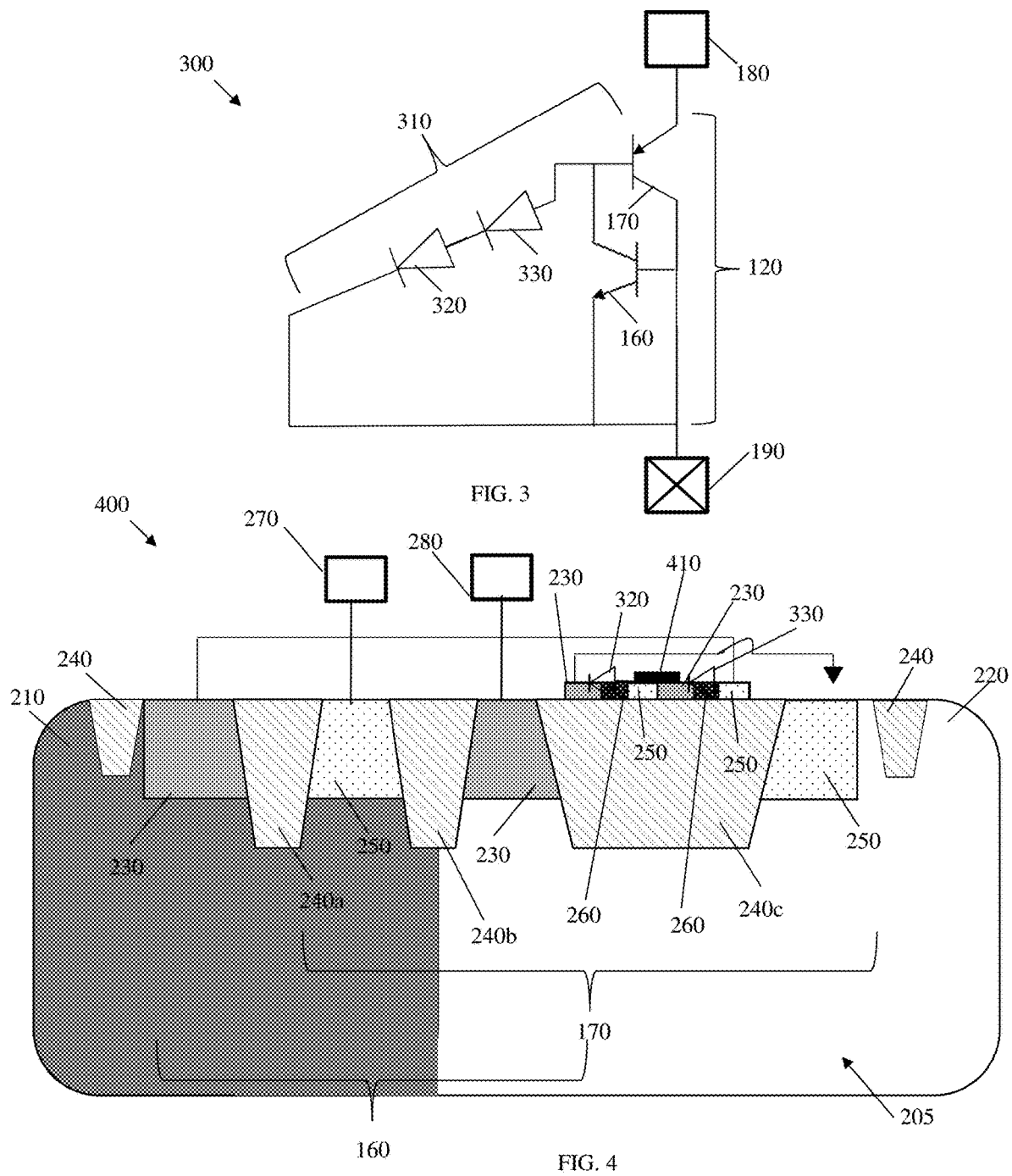
FIG. 3 shows another schematic diagram of a diode triggered silicon controlled rectifier (DTSCR) in accordance with aspects of the present disclosure.
FIG. 4 shows a cross sectional view of the DTSCR in FIG. 3, in accordance with aspects of the present disclosure.

FIG. 3 shows a schematic diagram of a diode triggered silicon controlled rectifier (DTSCR) in accordance with additional aspects of the present disclosure. In FIG. 3, the DTSCR structure 300 is similar to the DTSCR structure 100, except for the string 310. In embodiments, the string 310 comprises polysilicon trigger diodes 320 and 330. In contrast to FIG. 1, the polysilicon trigger diodes 320 and 330 are formed on a single shallow trench isolation (STI) region 240c to avoid a Darlington connection (i.e., a Darlington effect).

In order to form trigger diodes 320 and 330 on a single STI region 240c, silicide material is used to connect the trigger diodes 320 and 330 together. By using silicide material to connect the trigger diodes 320 and 330 together, less wiring capacitance is needed and there is no additional cost or footprint. Although FIG. 3 shows two trigger diodes (i.e., polysilicon trigger diodes 320 and 330), embodiments are not limited and could be multiple trigger diodes (e.g., up to five trigger diodes or greater). Also, in FIG. 3, the SCR anode to cathode spacing is reduced, which leads to a lower on resistance.

FIG. 4 shows a cross sectional view of the DTSCR in FIG. 3, in accordance with aspects of the present disclosure. In particular, the structure 400 is similar to FIG. 2, with the exception of the trigger diodes 320 and 330 formed on the STI region 240c and silicide 410. Further, in FIG. 4, there are no trigger diodes, P+ regions, N+ regions, silicide, or polysilicon formed on STI regions 240a and 240b.

Still referring to FIG. 4, trigger diodes 320 and 330 are formed on the STI region 240c. Further, each of the trigger diodes 320 and 330 comprise the N+ regions 230, polysilicon 260, and the P+ regions 250 and are formed on the STI region 240c. The silicide 410 is formed on the P+ region 250 and the N+ region 230 and is used to connect the trigger diodes 320 and 330 together in series, which avoids the Darlington connection (i.e., a Darlington effect). In a specific embodiment, the STI regions 240a and 240b have a smaller critical dimension (i.e., width) than the STI region 240c, which leads to a lower on resistance.

As should be understood by those of skill in the art, the silicide process begins with deposition of a thin transition metal layer, e.g., nickel, cobalt or titanium, over fully formed and patterned semiconductor devices (e.g., doped or ion implanted N-well 210 and P-well 220). After deposition of the material, the structure is heated allowing the transition metal to react with exposed silicon (or other semiconductor material as described herein) in the active regions of the semiconductor device (e.g., doped or ion implanted N-well 210 and P-well 220) forming a low-resistance transition metal silicide. Following the reaction, any remaining transition metal is removed by chemical etching, leaving silicide 410 in the active regions of the device.

Figure 5:
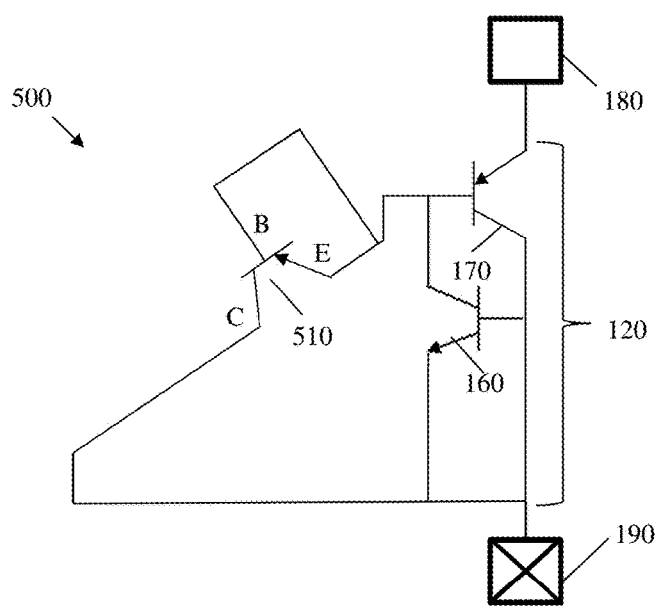
FIG. 5 shows a schematic diagram of a bipolar trigger silicon controlled rectifier (SCR) in accordance with aspects of the present disclosure.

FIG. 5 shows a schematic diagram of a bipolar trigger silicon controlled rectifier (SCR) in accordance with aspects of the present disclosure. In FIG. 5, the bipolar SCR structure 500 is similar to the DTSCR structure 100, except for the trigger bipolar device 510. Specifically, the trigger bipolar device 510 is a PNP device which is formed on a single trench isolation (STI) region 240c to avoid a Darlington connection (i.e., a Darlington effect). In FIG. 5, the trigger bipolar device 510 includes an emitter E which is connected to a base B of the trigger bipolar device 510 and a collector C of the trigger bipolar device 510 which is connected to ground. Silicide is used to connect the base B of the trigger bipolar device 510 to the emitter E of the trigger bipolar device 510. By using the silicide to connect the base B to the emitter E of the trigger bipolar device 510, a wiring capacitance is reduced. In the bipolar SCR structure 500, no additional cost or footprint is needed. Also, by varying a base region width of the base B, a tuning trigger voltage can be obtained. Although FIG. 5 shows one trigger bipolar device 510, embodiments are not limited and could be multiple trigger bipolar devices (e.g., up to five trigger bipolar devices). Further, by increasing the number of trigger bipolar devices, an increased tunable trigger voltage can be obtained. The number of trigger bipolar devices can be in series or could be mixed in different configurations within the bipolar SCR structure 500. Also, in an alternative embodiment, the trigger bipolar device 510 can be a NPN device.

Figure 6:
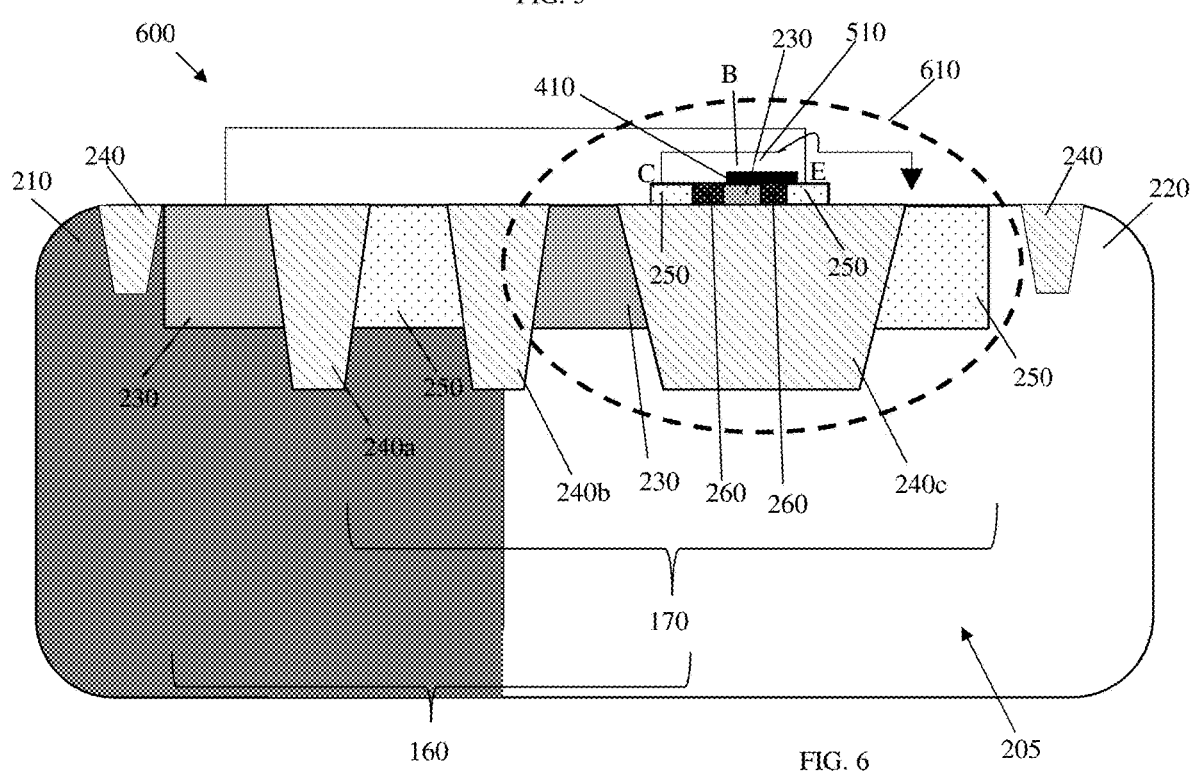
FIG. 6 shows a cross sectional view of the bipolar SCR of FIG. 5, in accordance with aspects of the present disclosure.

FIG. 6 shows a cross sectional view of the bipolar SCR of FIG. 5, in accordance with aspects of the present disclosure. In particular, the structure 600 is similar to FIG. 2, with the exception of the trigger bipolar device 510 formed on the STI region 240c and silicide 410. Further, there are no trigger diodes, trigger bipolar devices, P+ regions, N+ regions, silicide, or polysilicon formed on STI regions 240a and 240b. Silicide 410 is used to connect the base B of the trigger bipolar device 510 to the emitter E of the trigger bipolar device 510. By using the silicide 410 to connect the base B to the emitter E of the trigger bipolar device 510, a wiring capacitance is reduced.

Still referring to FIG. 6, the trigger bipolar device 510 is formed on the STI region 240c. Further, the trigger bipolar device 510 comprises the N+ region 230, polysilicon 260, and the P+ regions 250 formed on the STI region 240c. The silicide 410 is formed on the P+ region 250, the polysilicon 260, and the N+ region 230 and is used to connect the base B to the emitter E of the trigger bipolar device 510, which can avoid the Darlington connection (i.e., a Darlington effect) and reduce the wiring capacitance.

In a specific embodiment, the STI regions 240a and 240b have a smaller critical dimension (i.e., width) than the STI region 240c, which leads to a lower on resistance and optimizes the performance of the bipolar SCR structure 500.

The circled region 610 of the bipolar SCR structure 500 will be discussed in detail in FIG. 7.

Figure 7:
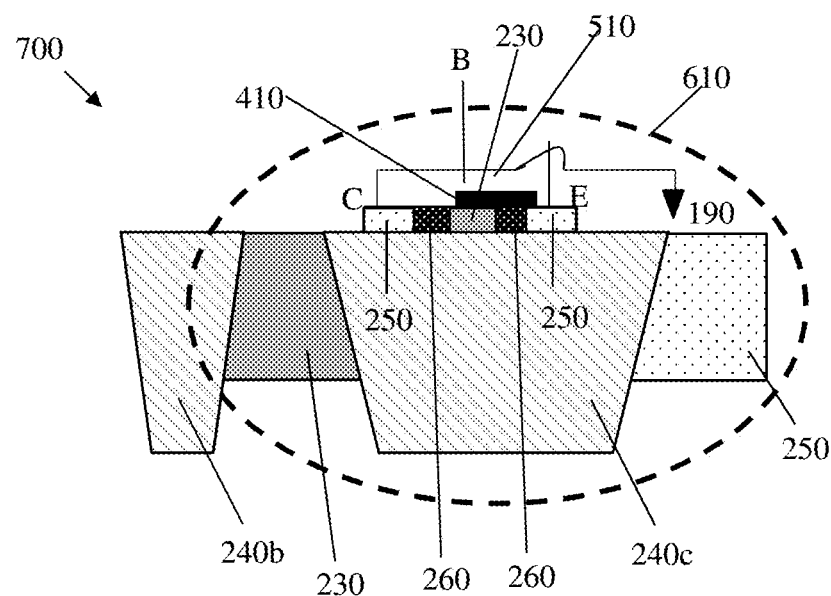
FIG. 7 shows a zoomed in image of a region of the cross sectional view of the bipolar SCR of FIG. 6, in accordance with aspects of the present disclosure.

FIG. 7 shows an enlarged view, in a cross-section, of the bipolar SCR of FIG. 6. In FIG. 7, the structure 700 includes the circled region 610 of FIG. 6, the ground 190, the N+ region 230, the STI regions 240b, 240c, the P+ regions 250, the polysilicon 260, the silicide 410, and the trigger bipolar device 510. As shown, the trigger bipolar device 510 has the collector C connected to the ground 190. The emitter E of the trigger bipolar device 510 is connected to the base B of the trigger bipolar device 510 through the silicide 410 (see also FIG. 5).

Figure 8:
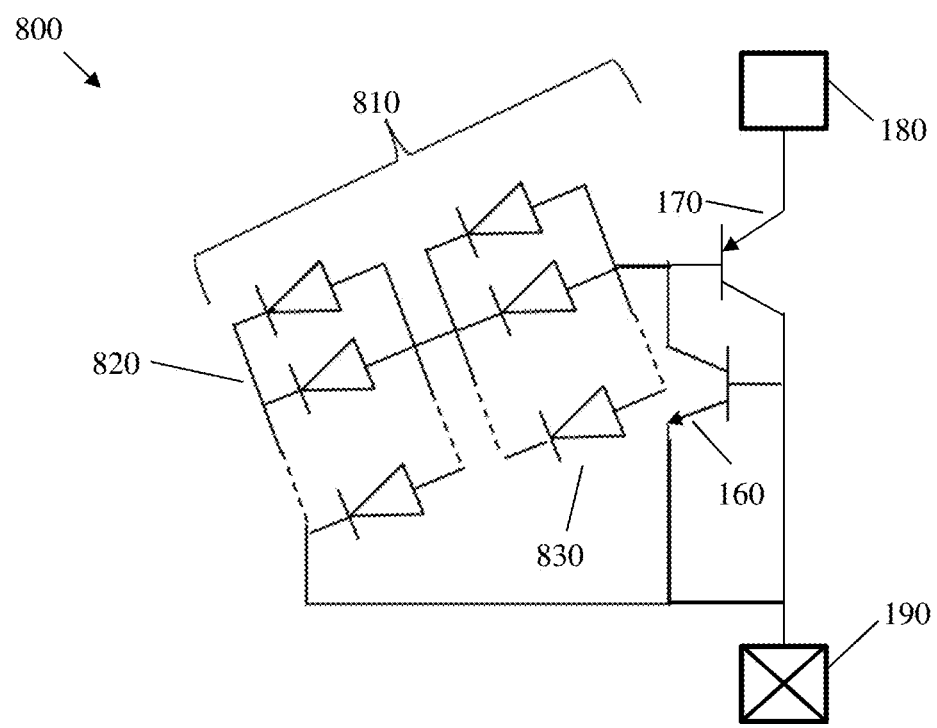
FIG. 8 shows a schematic diagram of a polysilicon DTSCR, in accordance with aspects of the present disclosure.

FIG. 8 shows a schematic diagram of a polysilicon DTSCR in accordance with aspects of the present disclosure. In FIG. 8, the polysilicon DTSCR structure 800 includes a string 810 comprising parallel polysilicon trigger diode structures 820 and 830. In embodiments, each of the parallel polysilicon trigger diode structures 820 and 830 comprise a plurality of polysilicon trigger diodes connected in parallel to increase drive current. Although FIG. 8 shows three polysilicon trigger diodes in each of the parallel polysilicon trigger diode structures 820 and 830, embodiments are not limited to three polysilicon trigger diodes and there could be two or more polysilicon trigger diodes (e.g., up to five trigger bipolar devices or greater) in each of the parallel polysilicon trigger diode structures 820 and 830.

Figure 9:
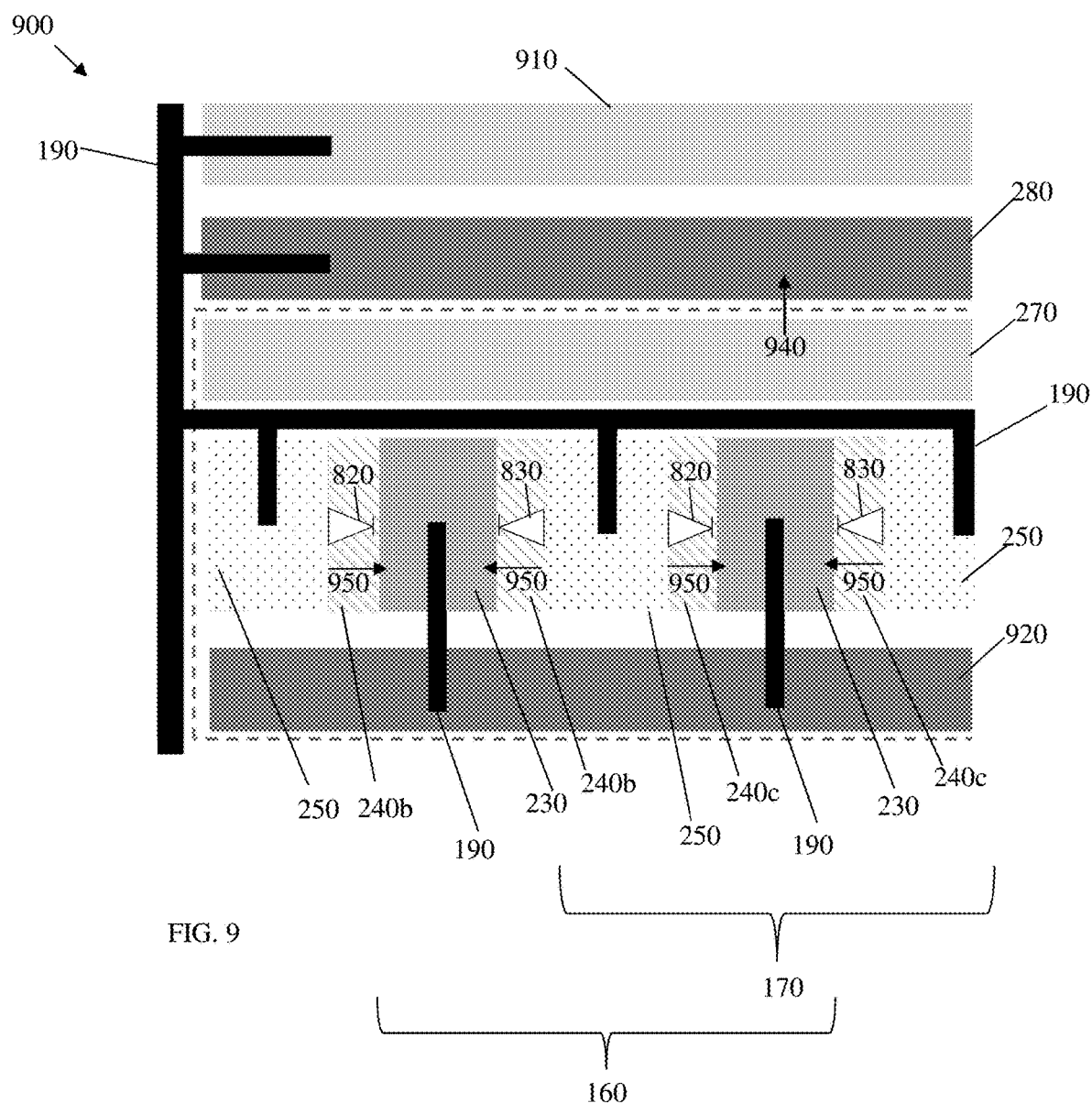
FIG. 9 shows a top view layout of the polysilicon DTSCR of FIG. 8, in accordance with aspects of the present disclosure.

FIG. 9 shows a top view layout of the polysilicon DTSCR of FIG. 8, in accordance with aspects of the present disclosure. In FIG. 9, the top view layout 900 of the polysilicon DTSCR includes the ground 190, the N+ regions 230, the STI regions 240b, 240c, the P+ regions 250, the anode 270 which is a P+ region, the cathode 280 which is a N+ region, the parallel polysilicon trigger diode structures 820, 830, the P-well contact (PWC) 910 which is a P+ region, and the N-well contact (NWC) 920 which is a N+ region. In embodiments, the N+ regions 230, the STI region 240b, and the P+ region 250 will form the NPN transistor 160. The N+ region 230, the STI region 240c, and the P+ region 250 will form the PNP transistor 170. In FIG. 9, the diode current flow 950 (i.e., diode current conduction) is perpendicular to the SCR current flow 940 (i.e., SCR current conduction).

The circuit and the method of operation for a polysilicon-diode triggered compact silicon controlled rectifier of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a polysilicon-diode triggered compact silicon controlled rectifier of the present disclosure has been adopted from integrated circuit (IC) technology. For example, the structures are built on wafers and are realized in films of material patterned by photolithographic processes on the top of a wafer. In particular, the fabrication of the circuit and the method for a polysilicon-diode triggered compact silicon controlled rectifier uses three basic building blocks: (i) deposition of thin films of material on a substrate, (ii) applying a patterned mask on top of the films by photolithographic imaging, and (iii) etching the films selectively to the mask.

The structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The DTSCR structure can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a silicon controlled rectifier (SCR) which comprises an n-well adjacent and in contact with a p-well, wherein the SCR comprises at least one shallow trench isolation (STI) region; and
    at least one polysilicon diode on top of the at least one STI region,
    wherein the at least one polysilicon diode comprises at least two sets of polysilicon diodes, each of the at least two sets of polysilicon diodes comprise at least three polysilicon diodes connected in parallel to each other.
2. The structure of claim 1, wherein the n-well is in direct contact with the p-well.
3. The structure of claim 2, wherein the at least two sets of polysilicon diodes are connected together in series by a silicide material.
4. The structure of claim 3, wherein each of the at least two sets of polysilicon diodes are on top of a single STI region of the at least one STI region.
5. The structure of claim 1, wherein the at least one STI region comprises at least three STI regions.
6. A structure, comprising:
    a silicon controlled rectifier (SCR) which comprises a PNP transistor and a NPN transistor in series; and
    at least one polysilicon diode connected to the PNP transistor and the NPN transistor,
    wherein the at least one polysilicon diode comprises at least two sets of polysilicon diodes, each of the at least two sets of polysilicon diodes comprise at least three polysilicon diodes connected in parallel to each other.
7. The structure of claim 6, wherein the at least two sets of polysilicon diodes are isolated from remaining portions of the SCR.
8. The structure of claim 7, wherein the at least two sets of polysilicon diodes are connected together in series by a silicide material.
9. A structure, comprising:
    a silicon controlled rectifier (SCR) which comprises a PNP transistor and a NPN transistor in series; and
    at least one polysilicon bipolar device connected to the PNP transistor and the NPN transistor,
    wherein the at least one polysilicon bipolar device comprises at least two sets of polysilicon bipolar devices, each of the at least two sets of polysilicon diodes comprise at least three polysilicon bipolar devices connected in parallel to each other.
10. The structure of claim 9, wherein each of the at least two sets of polysilicon bipolar devices are on top of a single shallow trench isolation (STI) region of the SCR.
11. The structure of claim 10, wherein each of the at least three polysilicon bipolar devices comprise a base, a collector, and an emitter, and the base is connected to the emitter by a silicide material.
12. The structure of claim 11, wherein the emitter is connected to the PNP transistor.
13. The structure of claim 1, wherein the at least one STI region comprises at least three STI regions, and a first STI region and a second STI region of the at least three STI regions have a larger critical dimension width than a third STI region of the at least three STI regions.
14. The structure of claim 13, wherein a first set of polysilicon diodes are on the first STI region and a second set of polysilicon diodes are on the second STI region.
15. The structure of claim 14, wherein each of the at least two sets of polysilicon diodes comprise at least five polysilicon diodes connected in parallel to each other.

* * * * *